United States Patent [19]

Kim et al.

[11] Patent Number: 5,262,657
[45] Date of Patent: Nov. 16, 1993

[54] OPTICALLY ACTIVATED WAFER-SCALE PULSER WITH ALGAAS EPITAXIAL LAYER

[75] Inventors: Anderson H. Kim, Toms River; Robert J. Youmans, Brick; Maurice Weiner, Ocean; Robert J. Zeto, Eatontown, all of N.J.; Louis J. Jasper, Jr., Fulton, Md.

[73] Assignee: The United States of America as represented by the Secretary of the Army, Washington, D.C.

[21] Appl. No.: 825,365

[22] Filed: Jan. 24, 1992

[51] Int. Cl.⁵ .................. H01L 33/00; H01J 40/14
[52] U.S. Cl. .............................. 257/86; 257/79; 257/94; 257/98; 250/214.1
[58] Field of Search ........... 357/30 FO; 250/211 J; 257/79, 86, 94, 98

[56] References Cited

U.S. PATENT DOCUMENTS

| | | |
|---|---|---|
| 5,060,028 | 10/1991 | Kuo et al. .............. 357/17 |
| 5,061,974 | 10/1991 | Onodera et al. ........ 357/17 |
| 5,146,075 | 9/1992 | Kim et al. ............ 250/211 J |

FOREIGN PATENT DOCUMENTS 0058369 4/1982 Japan.
0193376 10/1985 Japan.
0144888 7/1986 Japan.

OTHER PUBLICATIONS

A. Kim et al., "Monolithic, photoconductive impulse generator using a GaAs wafer", *Applied Physics Letters* 58(24), Jun. 17, 1991.

*Primary Examiner*—Jerome Jackson
*Assistant Examiner*—Valencia M. Martin
*Attorney, Agent, or Firm*—Michael Zelenka; William H. Anderson

[57] ABSTRACT

A device for generating pulses of radio frequency energy in response to pulses of laser light in which a circular wafer of GaAs has metallized annular layers ohmically bonded to the wafer by epitaxial GaAs layers, and an epitaxial layer of AlGaAs in the center of one of the annular epitaxial layers through which laser light is to be directed, there being a plurality of apertures in the metallized layer in contact with the AlGaAs epitaxial layer. In addition, an AlGaAs epitaxial layer may be formed opposite the first AlGaAs layer and an optical fiber is brought into contact with it so that laser light can be introduced at both sides of the wafer.

5 Claims, 6 Drawing Sheets

OPTICALLY ACTIVATED WAFER-SCALE PULSER WITH ALGAAS EPITAXIAL LAYER

GOVERNMENT INTEREST

The invention described herein may be manufactured, used, and licensed by or for the Government for governmental purposes without the payment to us of any royalty thereon.

FIELD OF THE INVENTION

The invention described herein is a device for generating wide band pulses of radio frequency energy.

BACKGROUND OF THE INVENTION

Recently, considerable progress has been made in the generation of high power pulses for application to a wide-band impulse transmitter by charging up the semiconductor material of a transmission line and discharging it by rendering the material at an end of the line conductive with a pulsed laser beam. This causes a traveling wave to flow to that end of the line that can be coupled to an antenna. Thus the semiconductor material stores the energy and acts as a switch. Coaxial and microstrip lines have been used, but radial transmission lines produce pulses of higher voltage because the traveling waves converge at its center.

A radial transmission line device and a system for using it to generate radio frequency pulses in response to pulses of laser light is described in an article entitled "Monolithic, photoconductive impulse generator using a GaAs wafer" that was authored by people including the inventors of this invention and which appeared in the Jun. 17, 1991 issue of "Applied Physics Letters 58 (24)".

Various aspects of this known system are shown in FIGS. 1, 2 and 3 wherein a disk 2 of semiconductor material such as GaAs has an annular metal layer 4 ohmically bonded to one surface 5 by n or p doped region 6 of the disk 2 and an annular metal layer 8 ohmically bonded to the other surface 9 by an n or p doped region 10. The central openings of the annular metal layer 4 and the underlying doped region 6 are respectively indicated as 12 and 14. An inner conductor 16 of a coaxial line 18 is ohmically bonded to the center of the opening 20 in the annular layer 8 by an n or p type doped region 22. The outer conductor 24 of the coaxial line 18 is ohmically adhered to the annular metal layer 8 by soldering or the like as indicated at 26.

Generation of RF pulses is achieved by connecting a source 28 of DC charging pulses between the metal layers 8 and 4 and directing much shorter trigger pulses of laser light from a source 30 through the openings 12 and 14. In a matter of nanoseconds, the laser light renders the central portion of the wafer 2 conductive so that the capacitor formed by the disk 2 and the metal layers 4 and 8 is discharged through a load impedance 32 that is connected between the inner and outer conductors 16 and 24 of the coaxial line 18. This causes RF waves to travel inwardly to the center of the wafer and along the transmission line 18. The load 32 is typically a remotely located antenna.

One of the problems encountered with the device just described is the inefficient manner with which the optical energy from laser diodes made of GaAs material is transferred to the wafer disk of GaAs. This means that a larger array of laser diodes must be used in order to transfer a required amount of optical energy to the disk. The resulting increase in the threshold current for driving the array increases the rise time of the laser pulses thereby limiting the range of RF frequencies that can be produced. The increase in threshold current also reduces the laser pulse repetition frequency so as to reduce the RF output power that may be attained.

Furthermore the thermal and mechanical stability of the known device is such as to reduce its life when high bias voltage and a high pulse repetition frequency are employed to increase its output power.

SUMMARY OF THE INVENTION

Instead of making the ohmic contacts between a substrate of semiconductor material made of GaAs and the metal layers on its top and bottom surfaces by doping the top and bottom surfaces in the required areas with n or p type material, the ohmic bonding is achieved by forming n or p type epitaxial layers of GaAs between the substrate and the metal layers. This increases the thermal and mechanical stability so as to increase the life of the device.

In accordance with another aspect of this invention, an optical window in the form of an AlGaAs epitaxial layer is formed on the substrate in the central area where the laser light enters it. Because the AlGaAs layer has a band gap energy from 1.42 to 2.16 electron volts and the GaAs used in the laser diodes has a typical band gap energy of 1.43 electron volts, the AlGaAs layer is transparent to the laser pulses and thereby increases the efficiency with which they enter the substrate.

BRIEF DESCRIPTION OF THE DRAWINGS

The invention is described in detail below with reference to the drawings, in which like items are indicated by the same reference designation, wherein.

DETAILED DESCRIPTION

Figure 1:
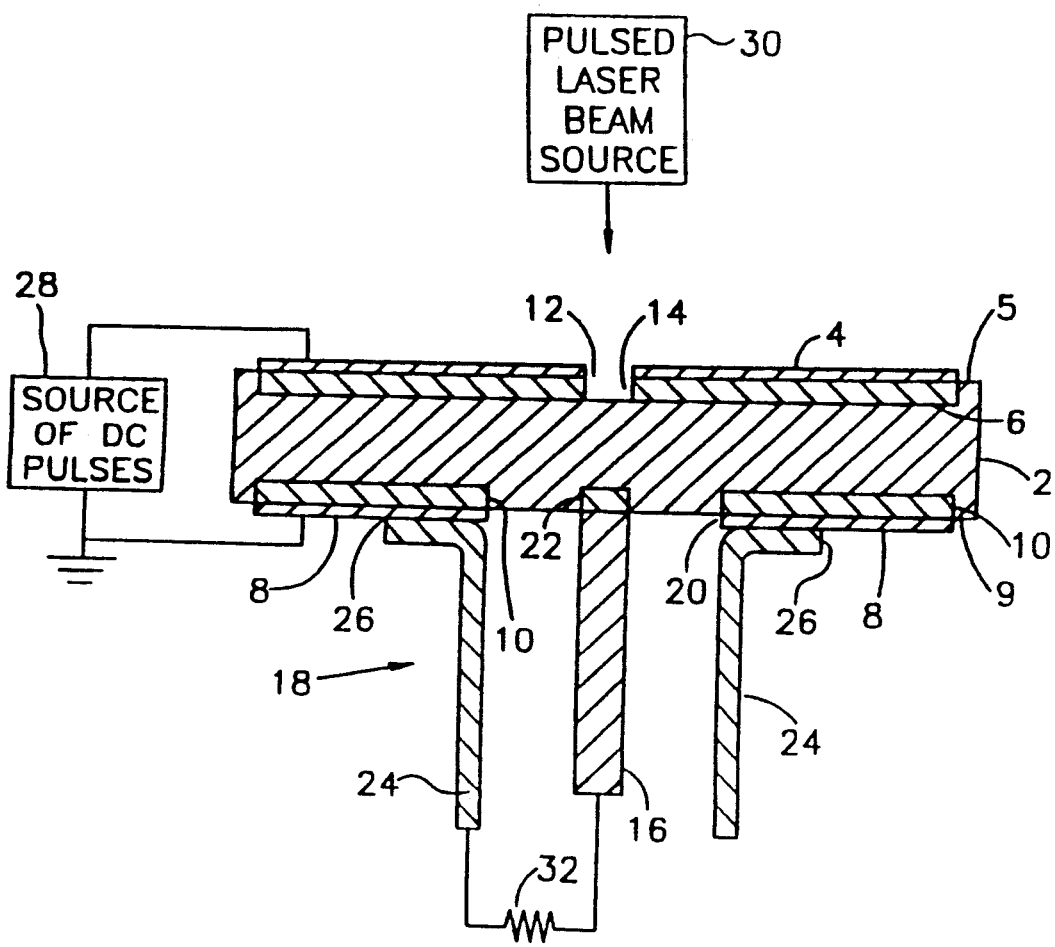
FIG. 1 shows a transverse diametric cross sectional view of a known device for generating radio frequency pulses and required operating components.
Figure 2:
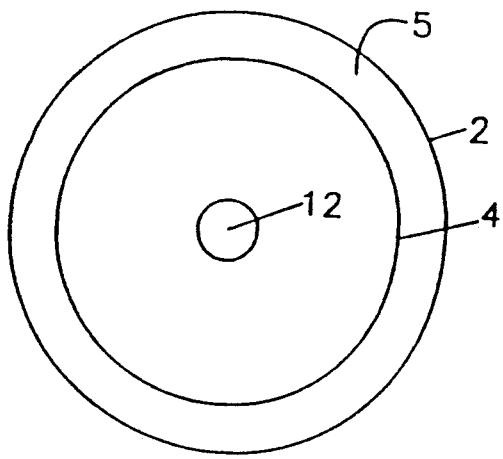
FIG. 2 is a top view of the device having a diametric cross section as depicted in FIG. 1.
Figure 3:
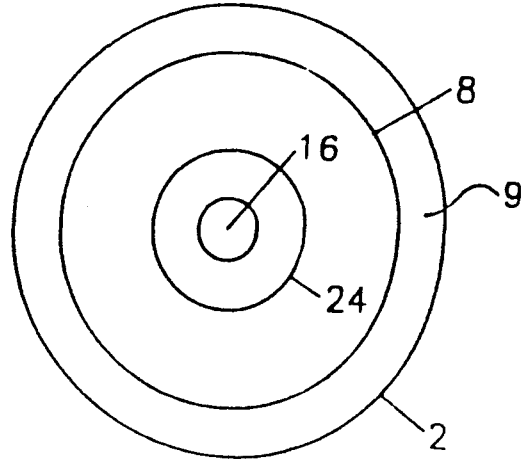
FIG. 3 is a bottom view of the device depicted in FIG. 1.
Figure 4:
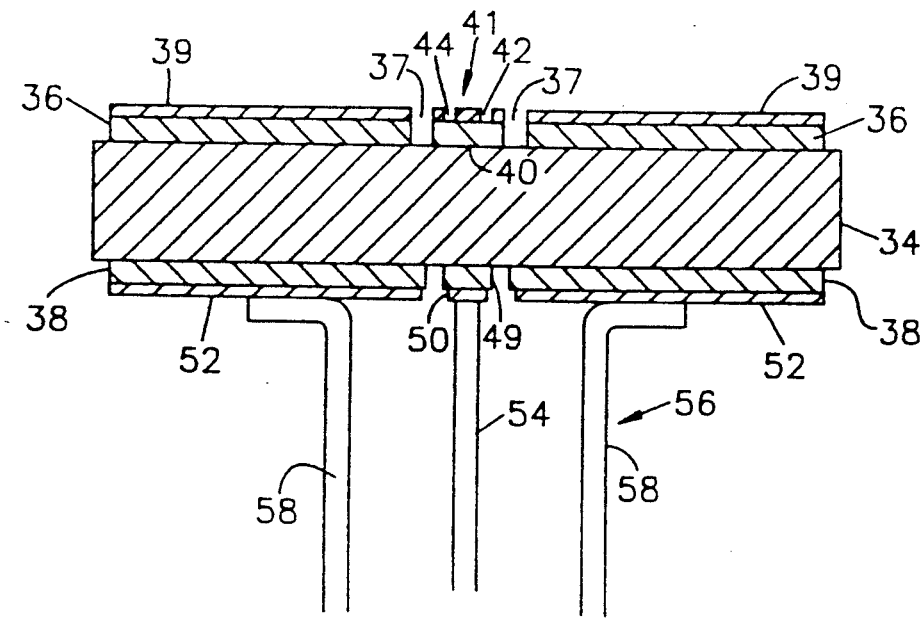
FIG. 4 is a transverse diametric cross sectional view taken along 4—4 of FIG. 5 of a wafer type RF pulse generating device of this invention having laser light entering from the top.
Figure 5:
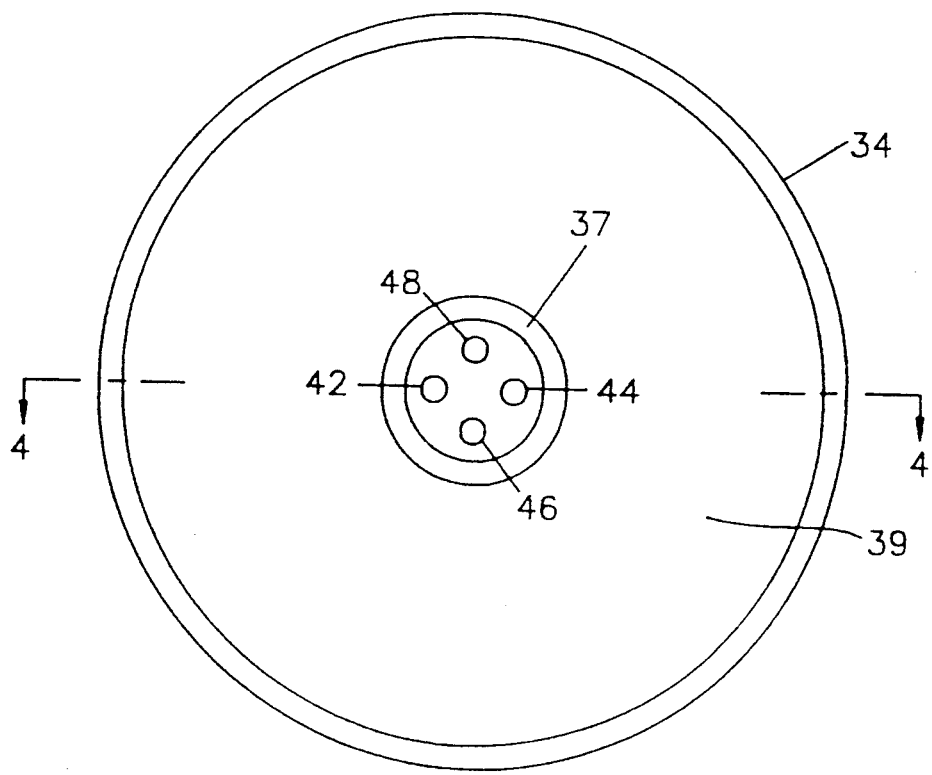
FIG. 5 is a top view of the wafer type RF pulse generating device of this invention shown in FIG. 4.
Figure 6:
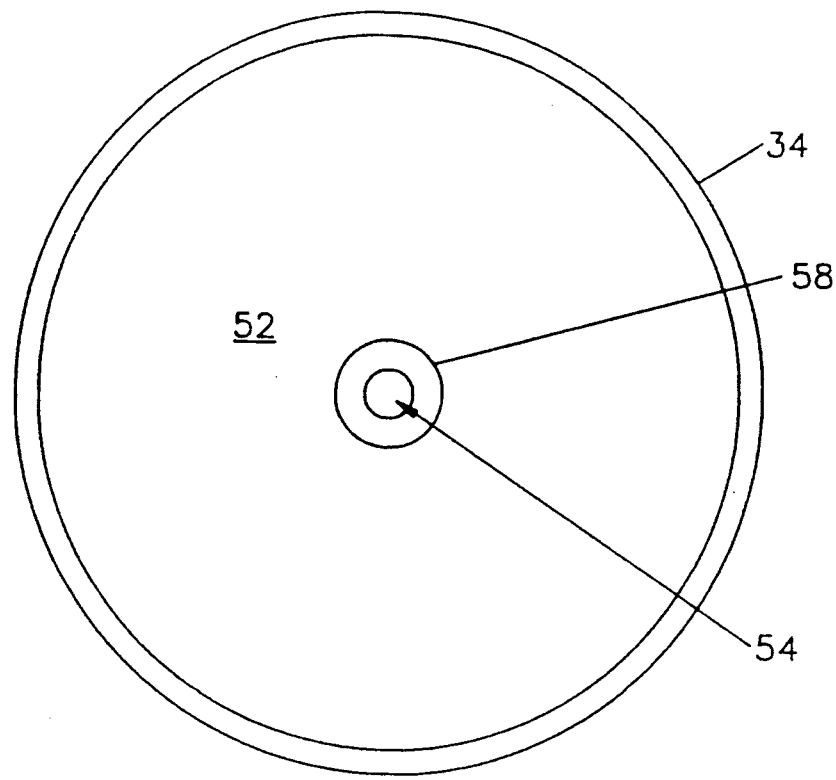
FIG. 6 is a bottom view of the wafer type RF pulse generating device of this invention as depicted in FIG. 4.

FIGS. 4, 5 and 6 are respectively a diametric cross section, top and bottom views of a wafer type RF pulse generating device of this invention wherein trigger pulses of laser light enter from one side. A wafer, which may in this example be in the form of disk 34 of semiconductor material such as GaAs, preferably has an annular n type epitaxial annular layer 36 formed on one side (top) thereof and a p type annular layer 38 formed on the other side (bottom) thereof, but the epitaxial layers 36 and 38 may be of n or p types that are the same or different.

In accordance with one aspect of this invention, an optical window is formed by an AlGaAs epitaxial layer 40 o the top face of disk 34 within the center of the annular epitaxial layer 36 and separated therefrom as indicated at 37. The outer surface 15 of the annular epitaxial layer 36 is metallized as indicated at 39 to form an electrode, and the central epitaxial layer 40 is metallized to form a grid 41 of apertures such as, for example, apertures 42, 44, 46 and 48 shown in FIG. 5. Only apertures 42 and 44 appear in FIG. 4. The grid 41 of apertures can have various degrees of openness. Note that alternatively epitaxial layer 40 can be eliminated to leave a centrally located aperture through metallization layer 39 and epitaxial layer 36 to the disk 34.

With reference to FIGS. 4 and 6, a p type epitaxial layer 49 is preferably formed o the bottom face of the disk 34 in the center thereof and spaced from and concentric with the p type epitaxial layer 38. The layers 38 and 49 are metallized as indicated at 50 and 52, respectively. An inner conductor 54 of a coaxial cable 56 is soldered or otherwise conductively connected to the metallized layer 50, and the outer conductor 58 of the coaxial cable 56 is conductively connected to the metallized layer 52. In order to provide longer leakage paths between the metallized layers 36 and 52, their diameters are less than the diameter of the disk 34.

Figure 7:
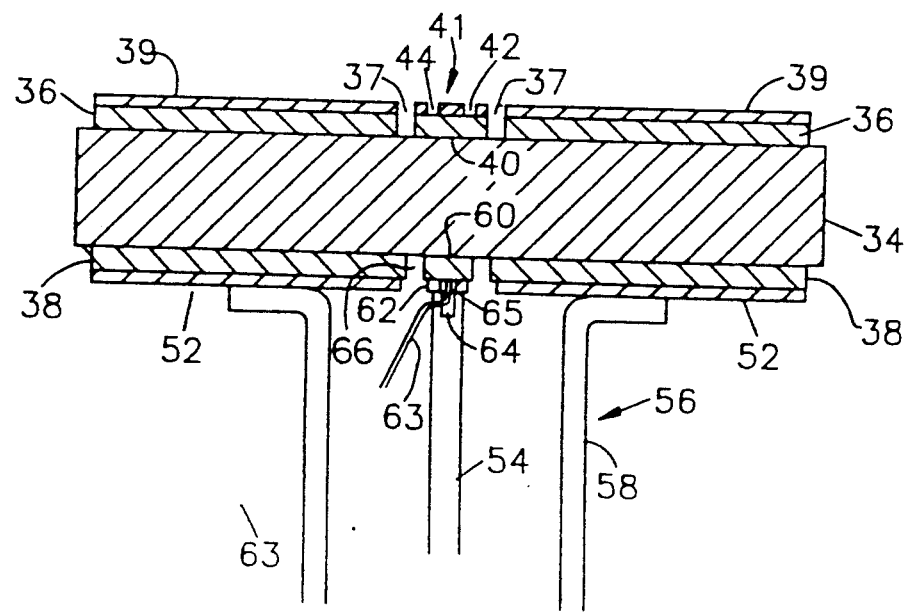
FIG. 7 is a transverse diametric cross section of wafer type RF pulse generating device of this invention having laser light entering from both the top and bottom faces thereof
Figure 8:
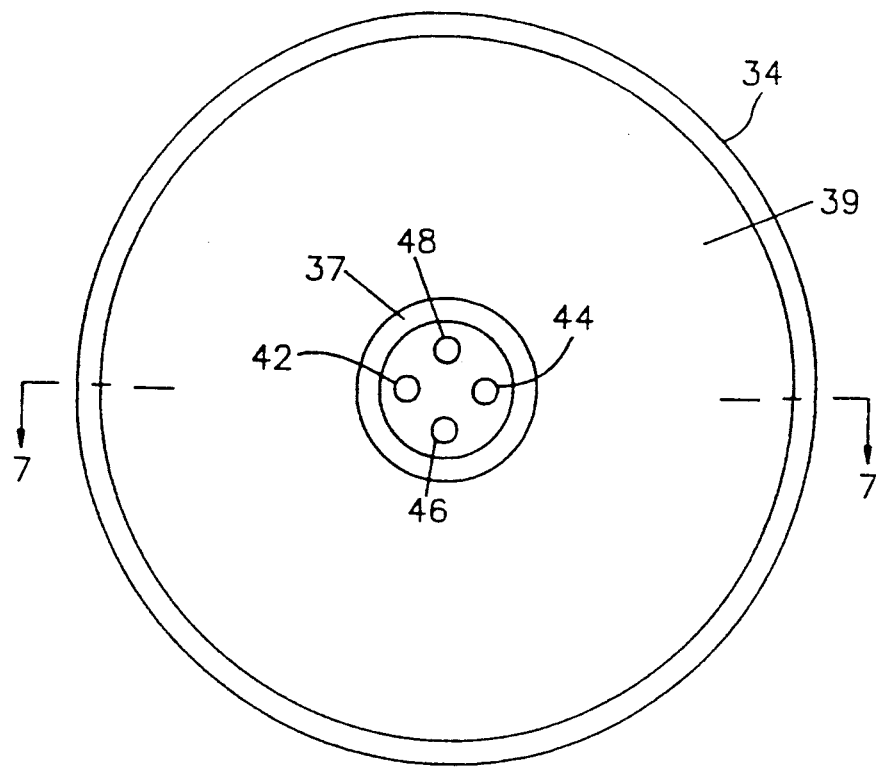
FIG. 8 is a top view of a wafer type RF pulse generating device as depicted in FIG. 7.
Figure 9:
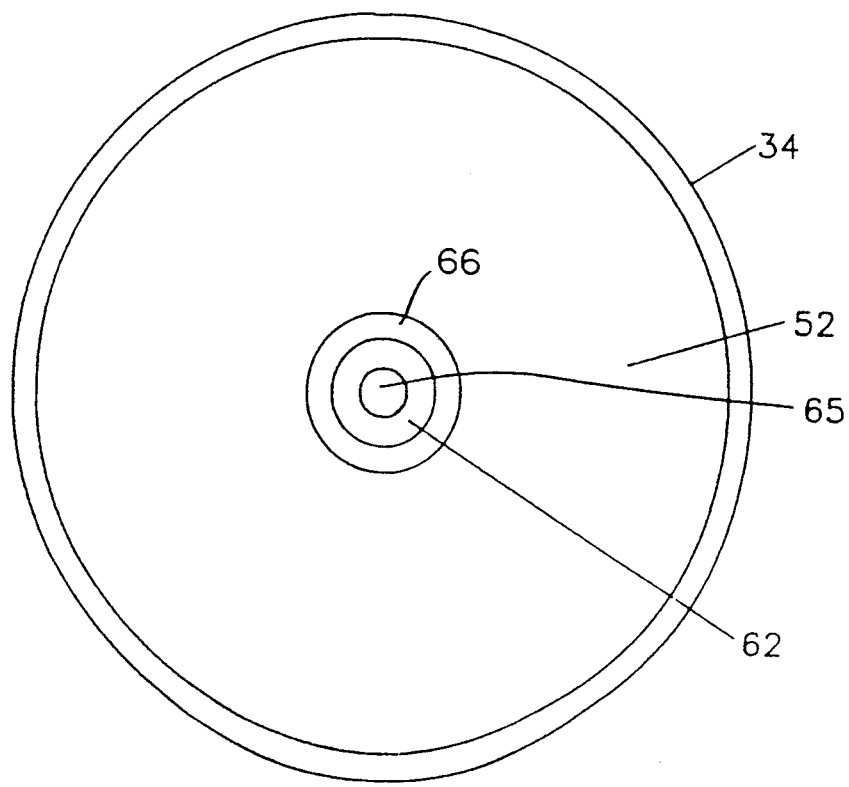
FIG. 9 is a bottom view of a wafer type RF pulse generating device as depicted in FIG. 7.

FIGS. 7, 8 and 9 are respectively a diametric cross section, top and bottom views of a wafer type RF pulse generating device of this invention wherein trigger pulses of laser light enter from both the top and bottom faces. Those parts of the device of FIGS. 7, 8 and 9 that correspond to parts shown in FIGS. 4, 5 and 6 are designated by the same numerals.

The difference between the device shown in FIGS. 7, 8 and 9 and the device shown in FIG. 4, 5 and 6 lies in the provision of means for directing laser light to the center of the bottom of the disk 34. In this particular example, an annulus 60 of p type epitaxial material is formed about the center of the bottom face so as to be concentric with the annular layer 38 and spaced from it via a circular channel 66. The annulus 60 is metallized as indicated at 62, and a cavity 64 is formed in the end of the inner conductor 54. The annular end of the inner conductor 54 is conductively attached to the metallized annulus 62. Pulses of laser light are conducted to the epitaxial layer 60 by a fiber optic bundle 63 that extends through a wall of the cavity 64 into aperture 65. The metallization 62 has a through hole 65 for receiving fiber optic 63 to permit the light to pass to AlGaAs epitaxial layer 60, to disk or substrate 34. Thus, the trigger pulses of laser light ca enter the disk 34 of semiconductor material from both the top and bottom faces, as well as only the top or bottom face. Using both faces for receiving trigger pulses reduces the time required to reorder the center of the disk 34 conductive with a given array of laser diodes.

Figure 10:
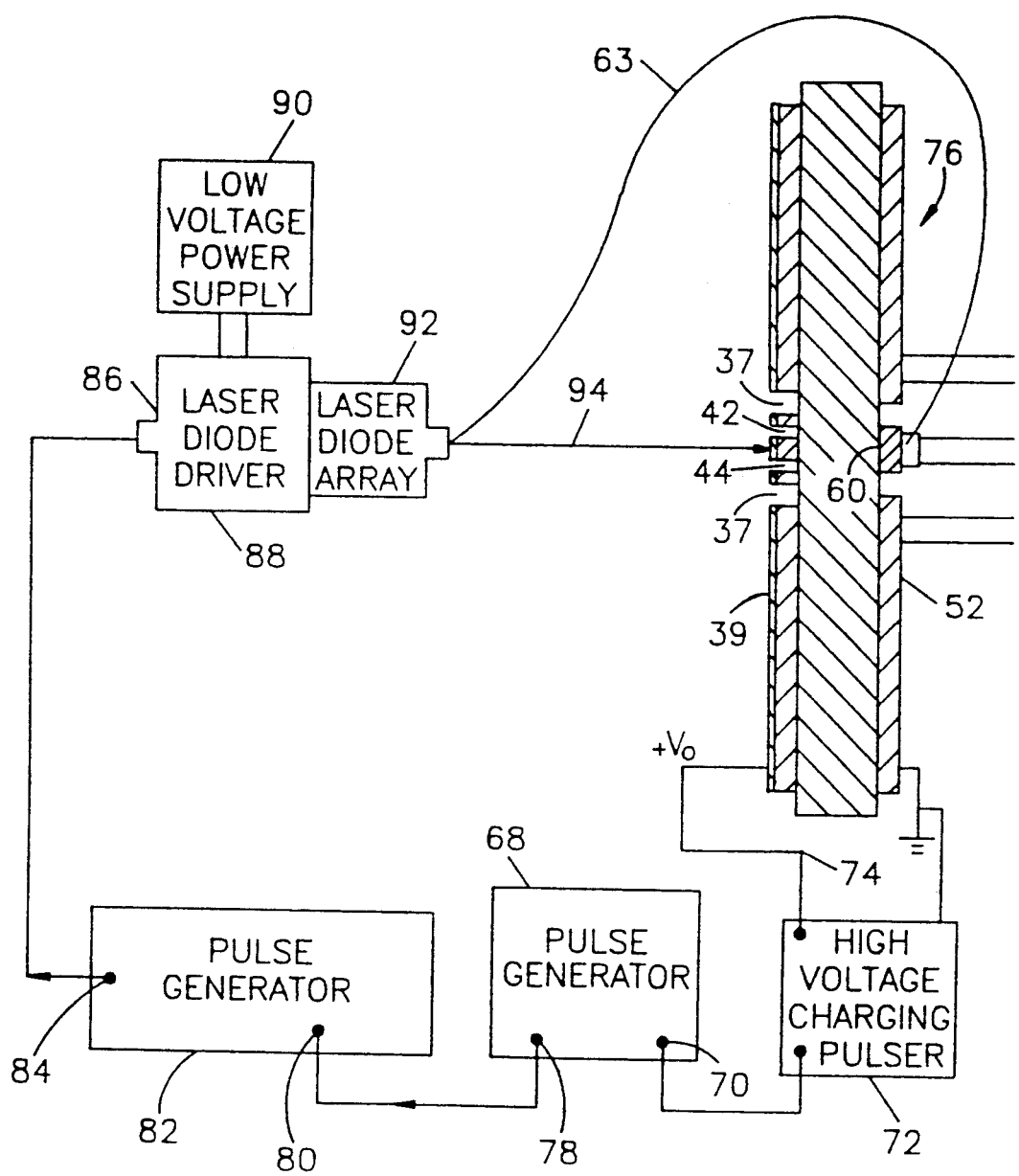
FIG. 10 is a block diagram for an RF pulse generating system utilizing a wafer type device depicted in FIGS. 7-9.

Reference is now made to the block diagram of FIG. 10 illustrating an RF pulsing system utilizing the wafer type device of FIGS. 7, 8 and 9. In this figure, the wafer device is generally shown in the same way as in FIG. 7.

A master pulse generator 68, which may be a Hewlett Packard Model 214B (manufactured by Hewlett-Packard, Palo Alto, Calif.) supplies a trigger pulse via an output 70 to a high voltage charging pulser 72. The output 74 of a high voltage charging pulser 72 (50 to 75 KV, 5.0 US charge time, manufactured by Signum Electronics, for example) is connected to the metallized electrode 37 of the wafer device 76, and the metallized surface 52 is connected to a potential to which all of the circuits are referenced in a manner not shown.

An output 78 of the master pulse generator 68 is connected to a trigger input 80 of a pulse generator 82 that may also be a Hewlett Packard Model 214 B, for example. The generator 82 provides a suitably delayed pulse at an output 84 that is coupled to an input 86 of a laser diode driver 88 (Model AVO-P, manufactured by AV Tech Electrosystems, Ltd., Ottowa, Canada, for example). The driver 88 derives its operating potential from a low voltage power supply 90. An array 92 of laser diodes (LDT 350 LED Array, manufactured by Laser Diode Corp., New Brunswick, N.J., for example) is coupled to the driver 88, and laser light is coupled by a bundle 94 of optical fibers to the grid 41 having apertures 42, 44, 46 and 48 therein and by the bundle 63 (see FIG. 7) of optical fibers to the AlGaAs epitaxial layer 60.

Figure 11:
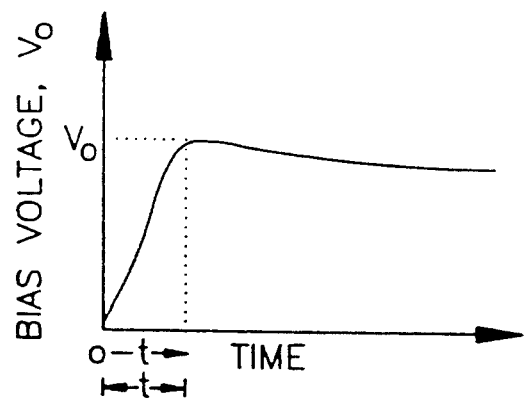
FIG. 11 is a graph illustrating the charging characteristics of a wafer type RF pulse generating device of this invention.
Figure 12:
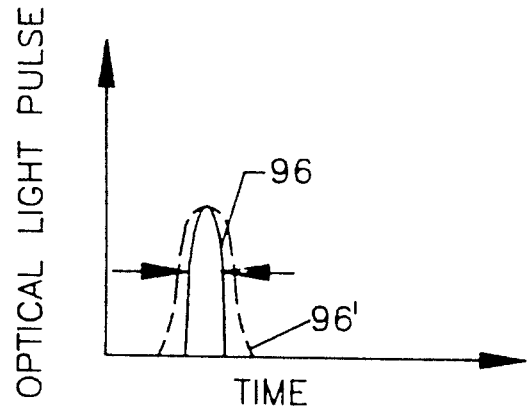
FIG. 12 is a graphical illustration of a laser pulse for triggering RF pulse generating wafer type devices of this invention as well as laser pulses for triggering known wafer type devices.
Figure 13:
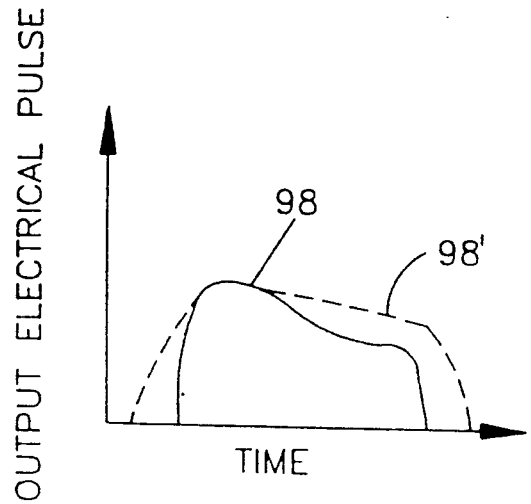
FIG. 13 is a graphical illustration of n output pulse provided by a system using the wafer type pulse generating device of this invention as well as an output pulse produced by a system using a known wafer type device.

Operation of the system of FIG. 10 is now explained by reference to the graphs of FIGS. 11, 12 and 13. The time scales represented by the abscissa of these figures are different. The time scale for FIG. Il is in hundreds of microseconds, and although the time scales for FIGS. 12 and 13 are in nanoseconds, the time scale for FIG. 13 is much expanded in respect to the time scale for FIG. 12. The graph of FIG. 11 shows the buildup of voltage between the metallized layers 37 and 52 following application of a high voltage pulse from the output 74 of the high voltage charging pulser 72. As can be seen, it takes a time t for the voltage to build up to a maximum value $V_O$.

Because of delay provided by the pulse generator 82, a pulse at its output 84 starts at the time t and causes the pulse of laser light produced by the diode array 92 to be as indicated at 96 of FIG. 12. The pulse 96 preferably has a width that is less than 40 ns. This is much shorter than the duration of the charging pulses at the output 74 of the pulser 72. The electrical output pulse 98 of FIG. 13 is preferably 2-4 ns, which is less in duration than the laser pulse 96 of FIG. 12, but Pulse 98 appears to be longer because of the time scale.

In order to produce as wide a range of radio frequencies as possible, the duration of the output pulse 98 should be as short as possible. This depends on the rate at which laser light energy is imparted to the semiconductor disk 34, and this in turn depends on the rise time of the triggering laser pulse 96. Thus, if the laser pulse had a slower rise time as indicated by the dashed curve 96' of FIG. 12, the output pulse would have a longer duration as indicated by the dashed line 98'. Because of the more efficient optical coupling of the epitaxial layers 40 and 60, the rate at which laser light is introduced to the disk 34 is increased for any given number of diodes in the array 92. As previously noted, increasing the number of diodes so as to increase the intensity of the laser light would also increase the required threshold current and slow down the rate of rise of the laser pulse.

Furthermore, the rapidity with which the semiconductor material at the center of the disk 34 can be made conductive is increased by subjecting it to laser light from both sides, thereby creating a more uniform carrier distribution throughout the semiconductor, and thereby leading to a sudden collapse of the electric field in the semiconductor.

Preferably, more than the four apertures 40, 42, 44 and 46 would be provided in the grid 41. The reason why having more than one aperture is beneficial is because a more uniform electrical field is established along the axis of the semiconductor disk 34.

Because the device is subjected to severe operating conditions such as high bias voltage such as $+V_O$ (see FIG. 10) and a high pulse rate frequency, its thermal and mechanical stability has been enhanced through use of the epitaxial layers 36 and 38 to provide the ohmic bonding of the grid 41 and the metallized layers 39, 50, 52 and 62.

Although various embodiments of the invention have been described and shown herein, they are not meant to be limiting. Those of skill in the art may recognize certain modifications to these embodiments, which modifications are meant to be covered by the spirit and scope of the appended claims. For example, materials other than GaAs and AlGaAs can be used. Also, the shape of the present device can be any practical shape not limited to a disk shape, such as square, rectangular, and so forth.

What is claimed is:

1. A device for use in generating pulses of radio frequency energy in response to pulses of laser light comprising:
    a substrate of given semiconductor material having a top surface and an opposing bottom surface;
    a first annular layer of highly doped semiconductor material having a band gap energy larger than that of said substrate, said annular member located substantially in the center of said top surface of said substrate;
    a second annular layer of highly doped semiconductor material having a band gap energy larger than that of said substrate located substantially in the center of said bottom surface of said substrate;
    a first center layer of AlGaAs material on said top surface of said substrate located in the center space of said first annular member and separated therefrom;
    a second center layer of highly doped semiconductor material having a band gap energy larger than that of said substrate located on said bottom surface of said substrate in the center space of said second annular member and separated therefrom;
    a third layer of metallized material on the outer surface of said first annular layer and said first center layer wherein said third layer material forms an electrode on said first annular layer and forms a grid of apertures on said first center layer such that an optical window is formed; and
    a fourth layer of metallized material on the outer surface of said second annular layer and said second center layer such that an electrode is formed over both said second annular layer and said center layer.

2. A device as set forth in claim 1 further comprising:
    a coaxial line having an inner conductor ohmically connected to said second center layer and an outer conductor ohmically connected to said second annular layer.

3. A device as set forth in claim 2 further comprising:
    means for illuminating said first center layer with laser light.

4. A device for generating pulses of radio frequency energy comprising:
    a disk of GaAs material;
    a first annular epitaxial layer of GaAs material that is one of n type and p type on one side of said disk;
    a first epitaxial layer of AlGaAs material on said one side of said disk in the center of and spaced from said first annular epitaxial layer;
    a first metallized layer on said first annular epitaxial layer;
    a second annular epitaxial layer of GaAs material that is one of n type or p type on the other side of said disk;
    a second epitaxial layer of AlGaAs material on said other side of said disk in the center of and spaced from said second annular epitaxial layer;
    a second metallized layer on said second annular epitaxial layer and said second epitaxial layer of AlGaAs material; and
    a coaxial cable having inner and outer conductors, said inner conductor being in conductive contact with the second metallized layer on said second epitaxial layer of AlGaAs and said outer conductor being in conductive contact with said second metallized layer on said second annular epitaxial layer.

5. A device as set forth in claim 4 further comprising:
    means for illuminating said second epitaxial layer of AlGaAs material with laser light.

* * * * *